US010593356B2

(12) United States Patent
Cao et al.

(10) Patent No.: US 10,593,356 B2
(45) Date of Patent: Mar. 17, 2020

(54) MANUFACTURING METHOD FOR READER SIDE SHIELD

(71) Applicant: Seagate Technology LLC, Cupertino, CA (US)

(72) Inventors: Xin Cao, Londonderry (GB); Frances Paula McElhinney, Derry (GB); Jiansheng Xu, Derry (GB); Marcus Winston Ormston, Derry (GB)

(73) Assignee: SEAGATE TECHNOLOGY LLC, Cupertino, CA (US)

(*) Notice: Subject to any disclaimer, the term of this patent is extended or adjusted under 35 U.S.C. 154(b) by 229 days.

(21) Appl. No.: 15/269,066

(22) Filed: Sep. 19, 2016

(65) Prior Publication Data

US 2017/0004852 A1 Jan. 5, 2017

Related U.S. Application Data

(62) Division of application No. 14/514,050, filed on Oct. 14, 2014, now Pat. No. 9,472,214.

(Continued)

(51) Int. Cl.
G11B 5/39 (2006.01)
G11B 5/31 (2006.01)
G11B 5/187 (2006.01)
G11B 5/11 (2006.01)
G11B 5/127 (2006.01)
(Continued)

(52) U.S. Cl.
CPC .............. G11B 5/3912 (2013.01); G11B 5/11 (2013.01); G11B 5/112 (2013.01); G11B 5/1272 (2013.01); G11B 5/1871 (2013.01); G11B 5/3116 (2013.01); G11B 5/3163 (2013.01); G11B 5/39 (2013.01); G11B 5/3903 (2013.01); G11B 5/3906 (2013.01); G11B 5/3929 (2013.01); G11B 5/3932 (2013.01); G11B 5/6082 (2013.01); H01L 25/50 (2013.01); Y10T 29/49032 (2015.01); Y10T 29/49041 (2015.01); Y10T 29/49043 (2015.01); Y10T 29/49046 (2015.01); Y10T 29/49048 (2015.01)

(58) Field of Classification Search
CPC ......... G11B 5/11; G11B 5/112; G11B 5/1272; G11B 5/3163; G11B 5/39; G11B 5/3903; G11B 5/3906; G11B 5/3912; G11B 5/3929; G11B 5/3932; G11B 5/6082; G11B 5/1871; G11B 5/3116; Y10T 29/49032; Y10T 29/49041; Y10T 29/49043; Y10T 29/49046; Y10T 29/49048; H01L 25/50
See application file for complete search history.

(56) References Cited

U.S. PATENT DOCUMENTS 4,702,794 A * 10/1987 Nakamura ........... G11B 5/3163 216/22
5,673,163 A 9/1997 Cohen
(Continued)

FOREIGN PATENT DOCUMENTS

JP 10284769 A 10/1998
JP 11259824 A * 9/1999

Primary Examiner — A. Dexter Tugbang
(74) Attorney, Agent, or Firm — Holzer Patel Drennan

(57) ABSTRACT

A magnetoresistive (MR) sensor shield shields against both down track and cross-track interference and is formed in a single deposition step. A "tail" portion of the shield is eliminated by including a non-magnetic material adjacent to opposite sides of a middle portion of the sensor stack.

7 Claims, 10 Drawing Sheets

Related U.S. Application Data

(60) Provisional application No. 61/890,747, filed on Oct. 14, 2013.

(51) Int. Cl.
  *G11B 5/60* (2006.01)
  *H01L 25/00* (2006.01)

(56) References Cited

U.S. PATENT DOCUMENTS

| | | | |
|---|---|---|---|
| 5,824,186 A * | 10/1998 | Smith | H01L 25/50 |
| | | | 438/597 |
| 6,201,673 B1 | 3/2001 | Rottmayer | |
| 6,980,403 B2 | 12/2005 | Hasegawa | |
| 7,392,577 B2 * | 7/2008 | Yazawa | G11B 5/1272 |
| | | | 29/603.12 |
| 8,066,892 B2 | 11/2011 | Guthrie et al. | |
| 8,120,874 B2 | 2/2012 | Hsiao et al. | |
| 8,335,058 B2 | 12/2012 | Xue et al. | |
| 8,347,488 B2 | 1/2013 | Hong et al. | |
| 8,422,168 B2 | 4/2013 | Hsiao et al. | |
| 8,451,562 B2 | 5/2013 | Pentek et al. | |
| 2003/0030943 A1 * | 2/2003 | Han | G11B 5/3903 |
| | | | 360/317 |
| 2004/0100737 A1 * | 5/2004 | Nakamoto | G11B 5/3912 |
| | | | 360/319 |
| 2007/0035888 A1 | 2/2007 | Sbiaa et al. | |
| 2008/0117552 A1 | 5/2008 | Zhou | |
| 2008/0253036 A1 * | 10/2008 | Kagami | G11B 5/11 |
| | | | 360/319 |
| 2010/0202088 A1 * | 8/2010 | Ohta | G11B 5/3932 |
| | | | 360/324.11 |
| 2011/0135961 A1 * | 6/2011 | Leng | Y10T 29/49032 |
| | | | 428/811.2 |
| 2012/0184053 A1 | 7/2012 | Sakamoto et al. | |
| 2013/0021697 A1 | 1/2013 | Dimitrov et al. | |
| 2014/0177093 A1 * | 6/2014 | Hoshino | G11B 5/3912 |
| | | | 360/75 |

* cited by examiner

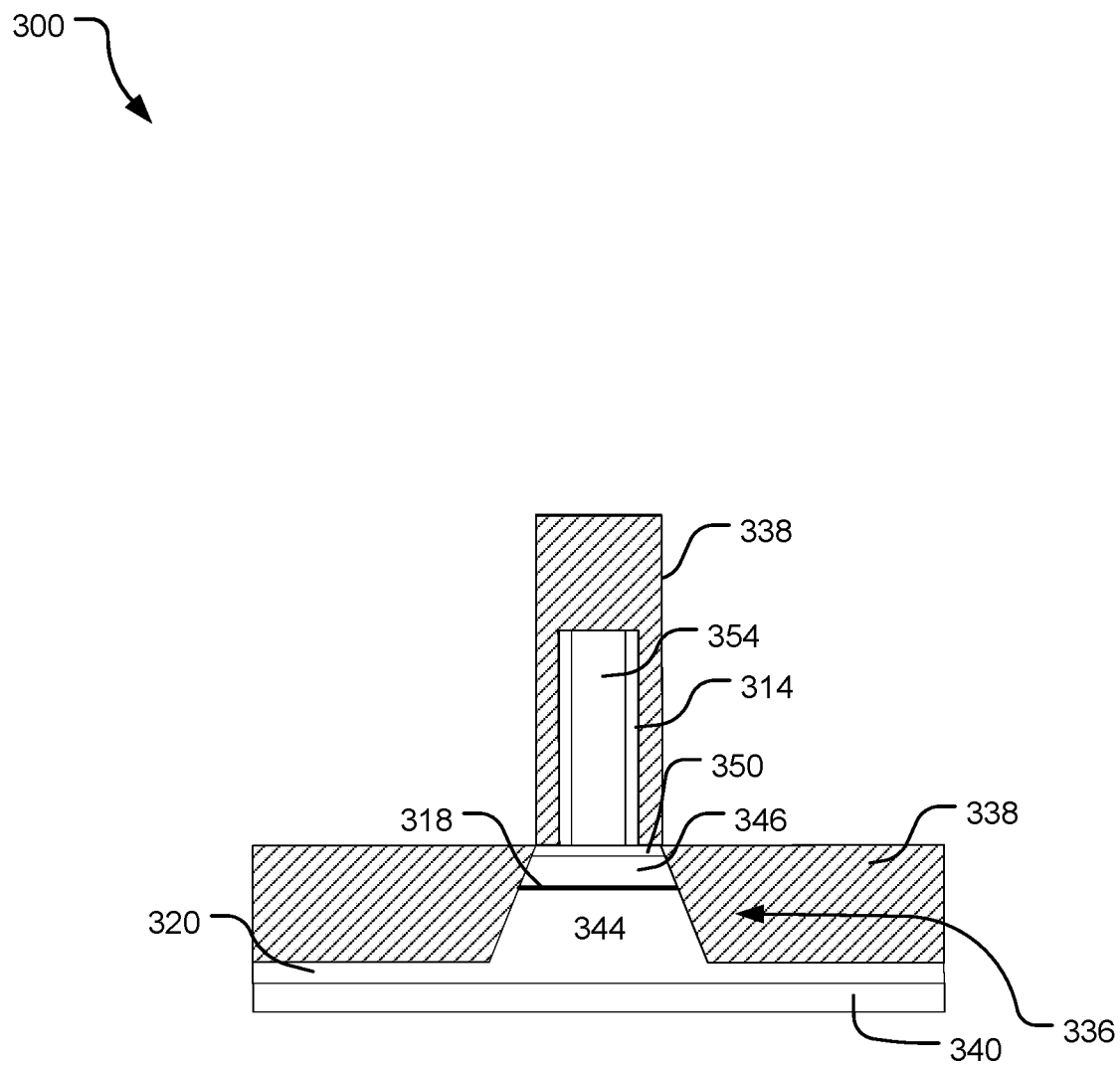
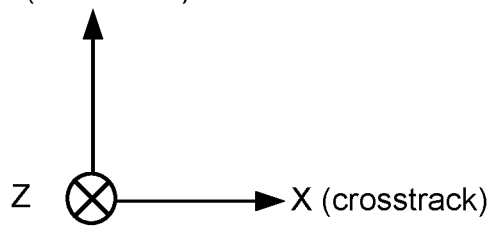
FIG. 3

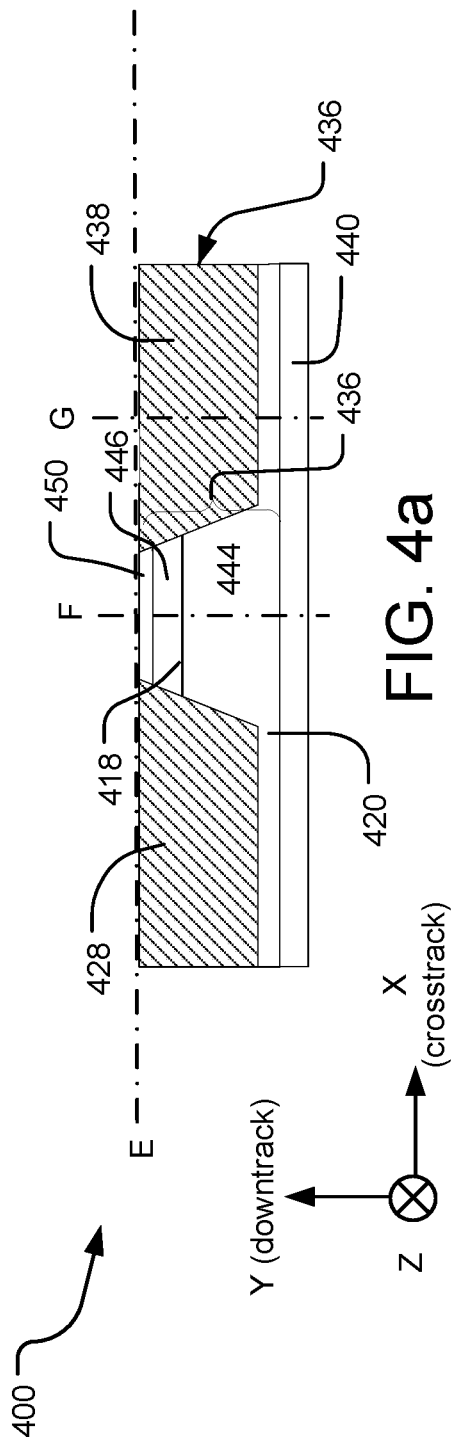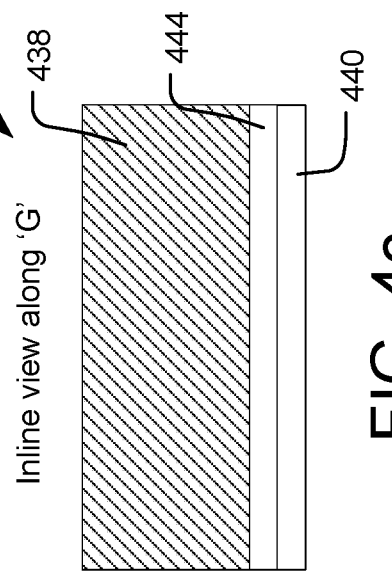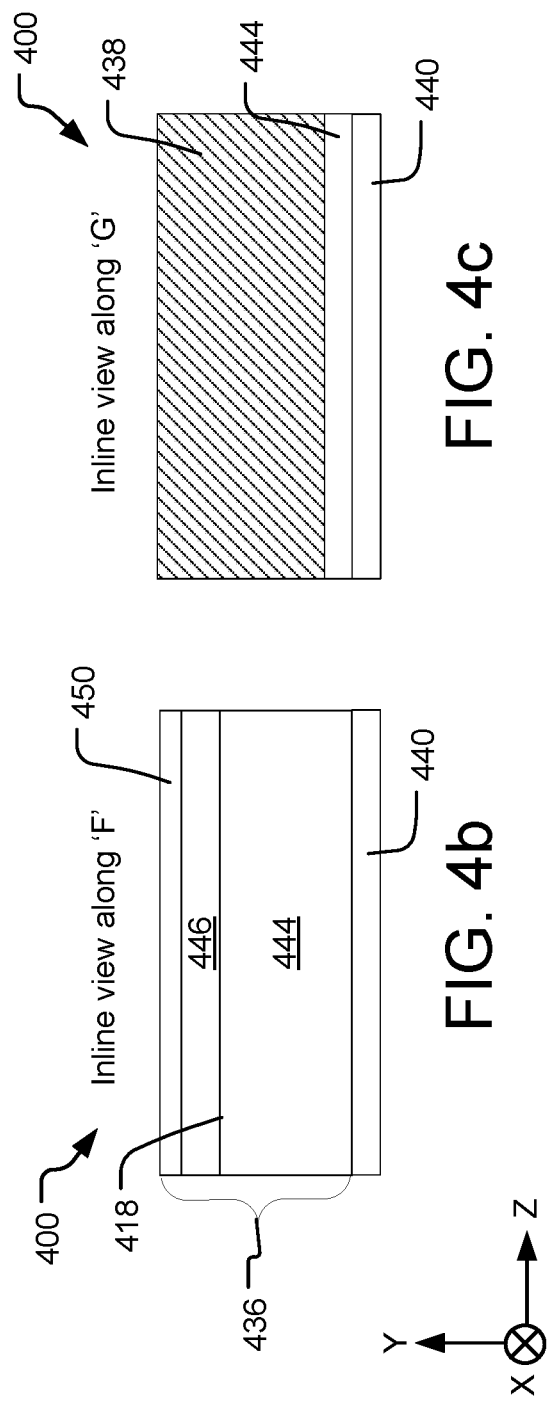
FIG. 4a
FIG. 4b
FIG. 4c

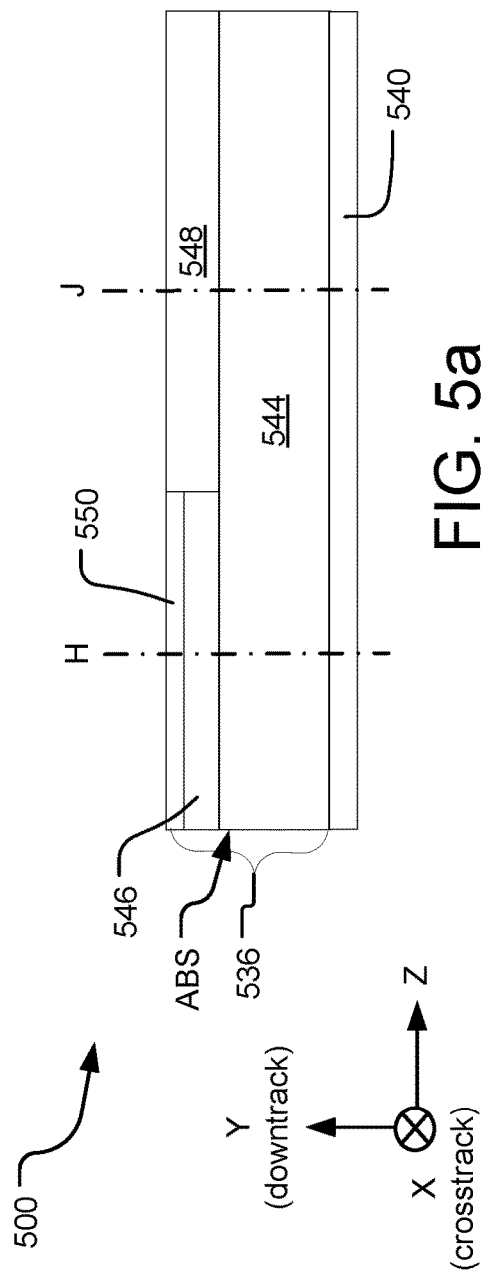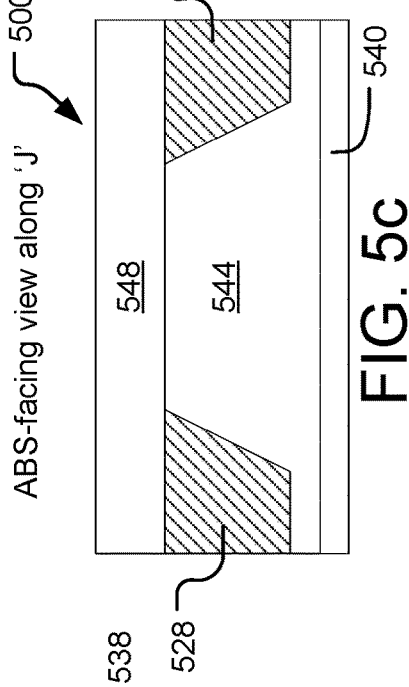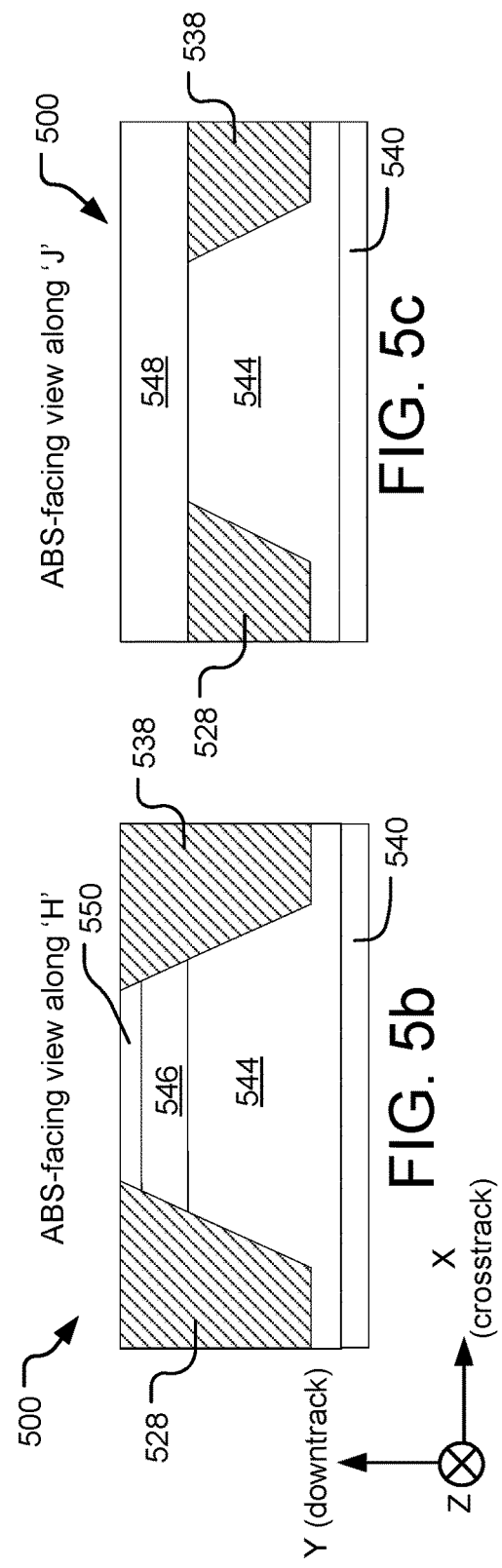

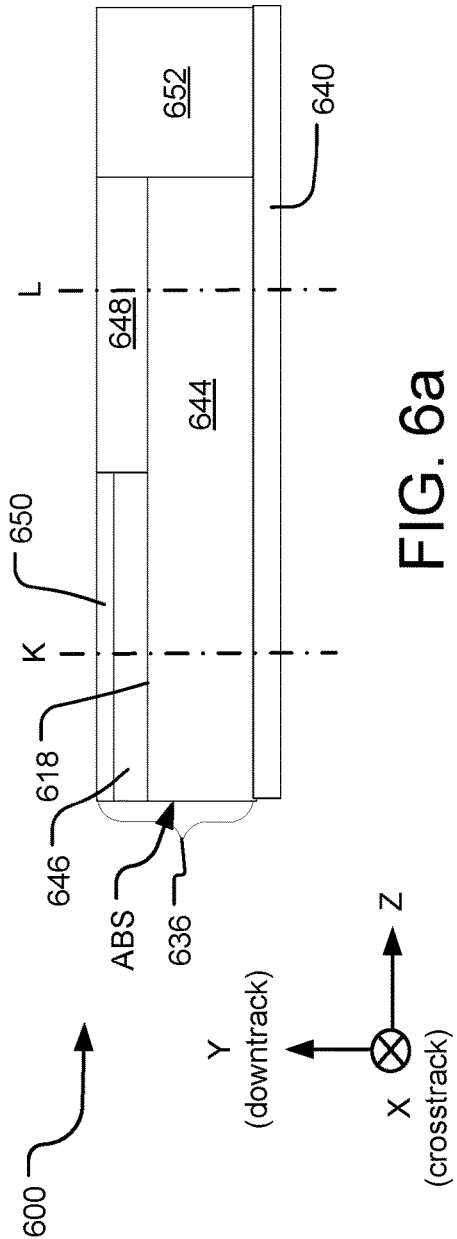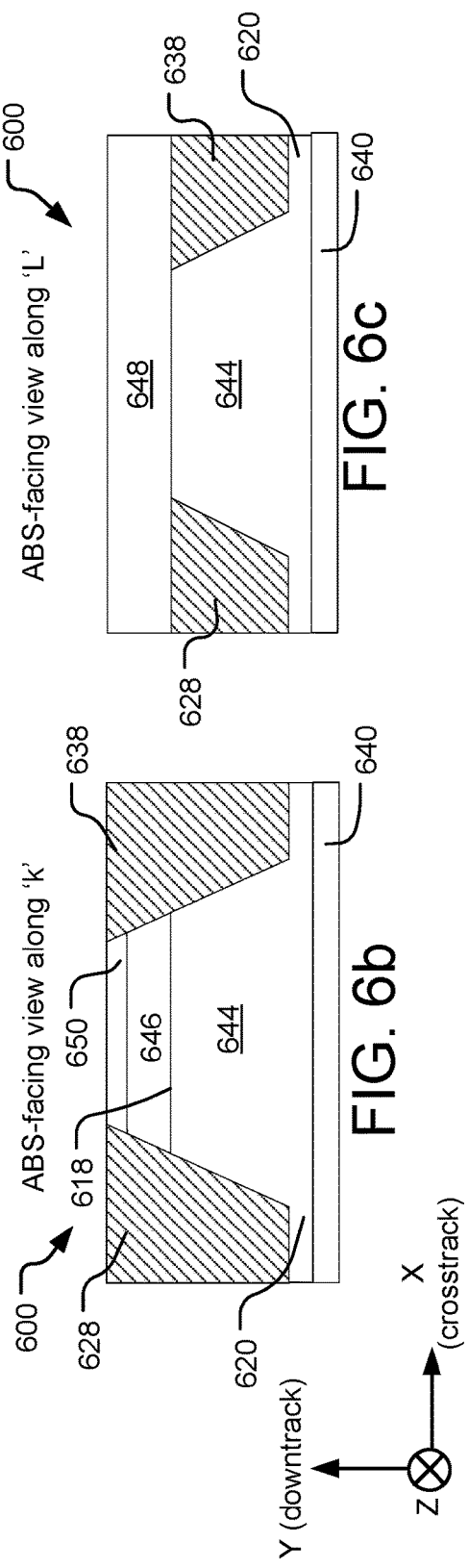

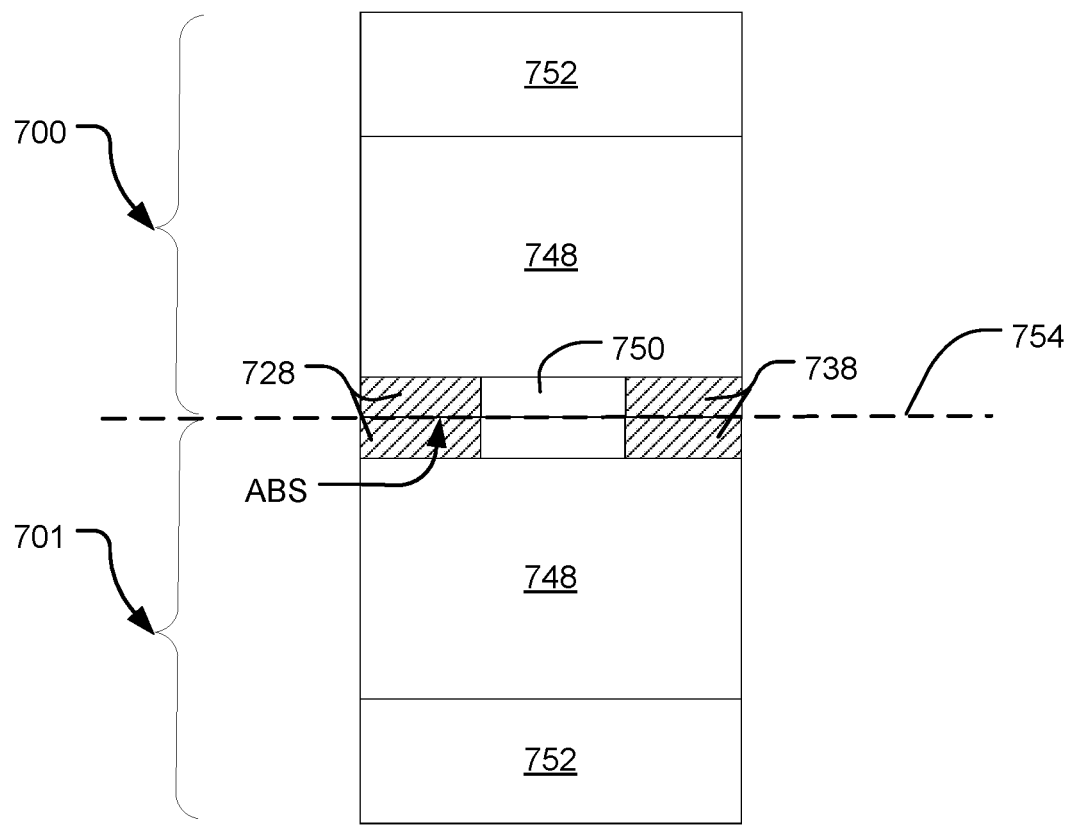
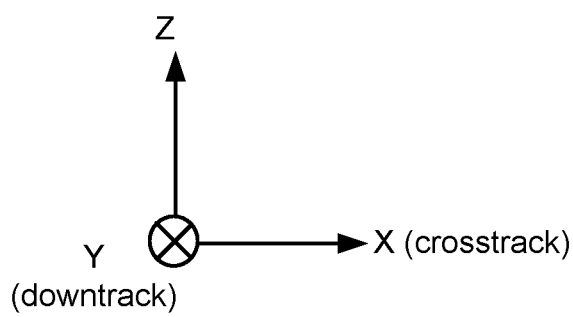
FIG. 7

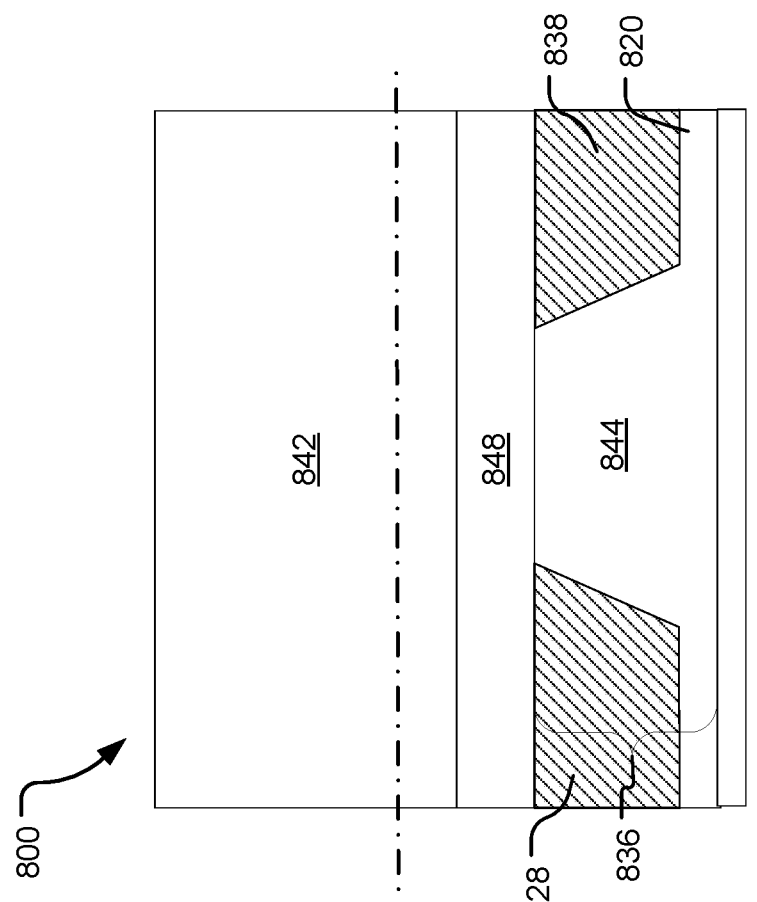
FIG. 8b
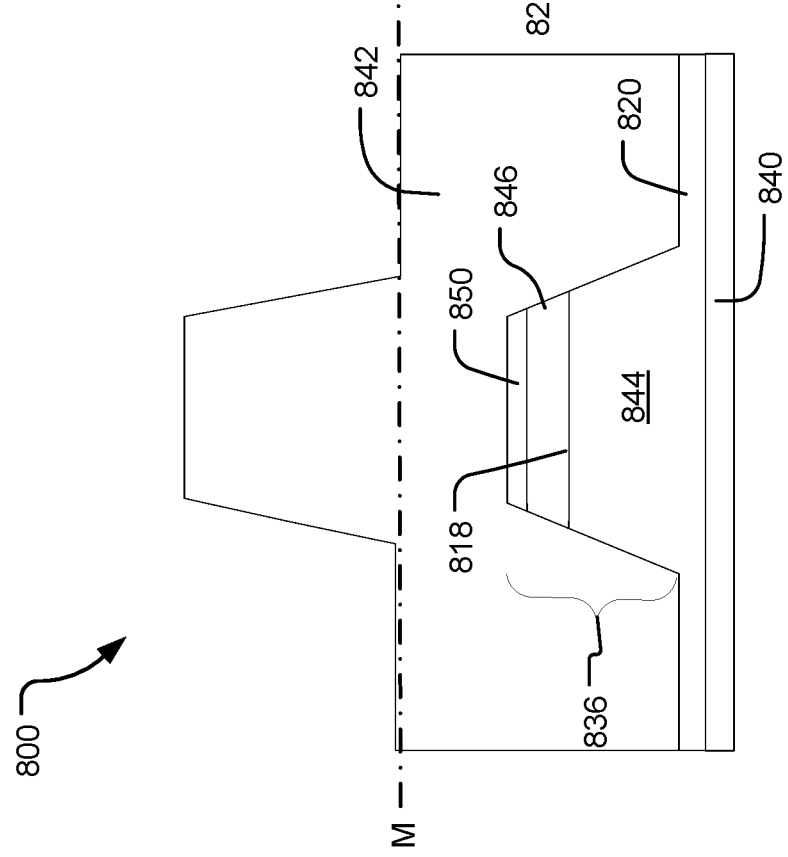
FIG. 8a
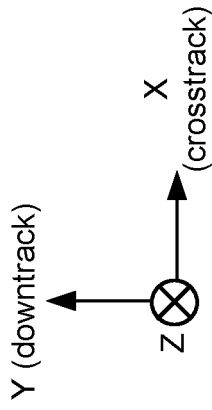

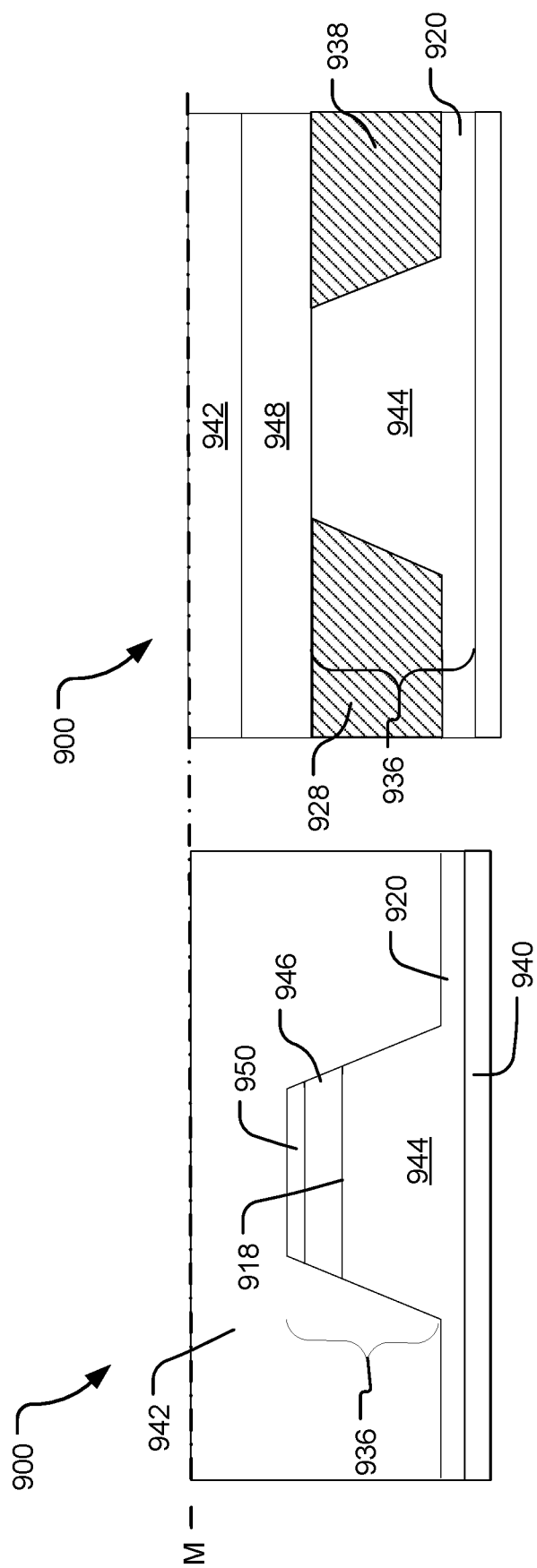
FIG. 9b
FIG. 9a
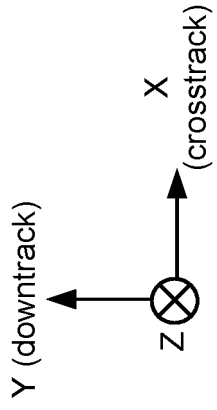

MANUFACTURING METHOD FOR READER SIDE SHIELD

CROSS REFERENCE TO RELATED APPLICATIONS

The present application is a divisional application of U.S. patent application Ser. No. 14/514,050, entitled "Reader Side Shield" and filed on Oct. 14, 2014, which claims priority to U.S. Provisional Patent Application Ser. No. 61/890,747, entitled "Reader Side Shield," and filed on Oct. 14, 2013. Both of these references are specifically incorporated by reference for all that they disclose or teach.

BACKGROUND

Generally, magnetic hard disc drives include transducer heads that read and write data encoded in tangible magnetic storage media. Magnetic flux detected from the surface of the magnetic medium causes rotation of a magnetization vector of a sensing layer or layers within a magnetoresistive (MR) sensor within the transducer head, which in turn causes a change in electrical resistivity of the MR sensor. The change in resistivity of the MR sensor can be detected by passing a current through the MR sensor and measuring the resulting change in voltage across the MR sensor. Related circuitry can convert the measured voltage change information into an appropriate format and manipulate that information to recover the data encoded on the disc.

As improvements in magnetic recording density capabilities are pursued, the dimensions of transducer heads continue to shrink. Typically, transducer heads are formed as a thin film multilayer structure having an MR sensor, among other structures. In some approaches, the thin film multilayer structure includes a synthetic anti-ferromagnet (SAF) to enhance MR sensor stability. However, existing thin film process and structure designs used in forming SAF-based MR sensors present effects that can nevertheless limit MR sensor performance and stability.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Other features, details, utilities, and advantages of the claimed subject matter will be apparent from the following more particular written Detailed Description of various implementations and implementations as further illustrated in the accompanying drawings and defined in the appended claims.

Implementations described and claimed herein address the foregoing by providing for formation of an upper shield element of a magnetoresistive (MR) sensor in a single deposition operation, the upper shield element adjacent to a top surface and a side surface of a sensor stack.

According to another implementation, a non-magnetic material is deposited adjacent opposite sides of a sensor stack. The non-magnetic material is removed from a front portion of the MR sensor proximal to an ABS and magnetic shield material is deposited on the front portion between the ABS and the first non-magnetic material.

Other embodiments are also described and recited herein.

BRIEF DESCRIPTIONS OF THE DRAWINGS

FIG. 3 illustrates an ABS-facing view of a front portion of an MR sensor at an early stage of an MR sensor manufacturing process.

FIG. 4a illustrates an ABS-facing view of a front portion of MR sensor at an early stage of an MR sensor manufacturing process FIG. 4b illustrates an inline view of an MR sensor taken along a plane F of FIG. 4a.

FIG. 4c illustrates an inline view of an MR sensor taken along a plane G of FIG. 4a.

FIG. 5a illustrates an inline view of another example MR sensor at an intermediate stage of an MR sensor manufacturing process.

FIG. 5b illustrates an ABS-facing view of a front portion of an MR sensor taken along a plane H of FIG. 5a.

FIG. 5c illustrates an ABS-facing view of a middle portion of an MR sensor taken along a plane J of FIG. 5a.

FIG. 6a illustrates an inline view of another example MR sensor at another intermediate stage of an MR sensor manufacturing process.

FIG. 6b illustrates an ABS-facing view of a front portion of an MR sensor taken along plane K of FIG. 6a.

FIG. 6c illustrates an ABS-facing view of a middle portion of an MR sensor taken along plane L of FIG. 6a.

FIG. 7 illustrates a top-down view (in the x-z plane) of an MR sensor at another stage of an MR manufacturing process.

FIG. 8a illustrates ABS-facing view of a front portion of another example MR sensor at a later stage of an MR sensor manufacturing process.

FIG. 8b illustrates an ABS-facing view of a middle portion the MR sensor of FIG. 8a.

FIG. 9a illustrates an ABS-facing view of a front portion of another example MR sensor.

FIG. 9b illustrates an ABS-facing view of a middle portion of another example MR sensor 900.

DETAILED DESCRIPTIONS

In some implementations, MR sensors are formed as a multilayer structure or stack in a thin film process. The MR sensor stack includes a first magnetic layer, called a "free" layer (FL), and a second magnetic layer, called a "reference layer" (RL). The free layer represents a sensing layer that responds to changes in magnetic flux detected from the surface of the magnetic surface (e.g., the magnetizing vector of the free layer rotates), while the response of the reference layer to such changes in magnetic flux are inhibited by a pinned layer (PL) which is separated from the reference layer by a thin nonmagnetic spacer layer. The reference layer, thin nonmagnetic spacer layer, and pinned layer act as an antiferromagnetic layer called a synthetic anti-ferromagnet (SAF) layer. In some configurations, an antiferromagnetic (AFM) material is deposited adjacent to the pinned layer to pin the magnetization of the pinned layer. In this manner, the MR sensor stack is further stabilized by the AFM layer. The MR sensor stack also includes a non-magnetic barrier layer separating the free layer from the reference layer. In this configuration, the free layer provides a free magnetization orientation $M_F$ direction substantially perpendicular to a reference magnetization orientation $M_R$ direction provided by the pinned layer.

The MR sensor is stabilized against the formation of edge domains, which can move and thereby result in electrical noise that makes data recovery difficult. Such stabilization can be achieved using a permanent magnet abutted junction design. In this scheme, permanent magnets with high coercive field (i.e., hard magnets) are placed at each end of the sensor. The field from the permanent magnets stabilizes the MR sensor by preventing edge domain formation and further providing proper bias. The MR sensor can also be stabilized by soft magnets with low coercive field instead of permanent magnets. In this scheme, the soft magnets act as side shields to improve sensor performance. An SAF structure may be deposited on top of the side shield to stabilize the side shield structure.

Figure 1:
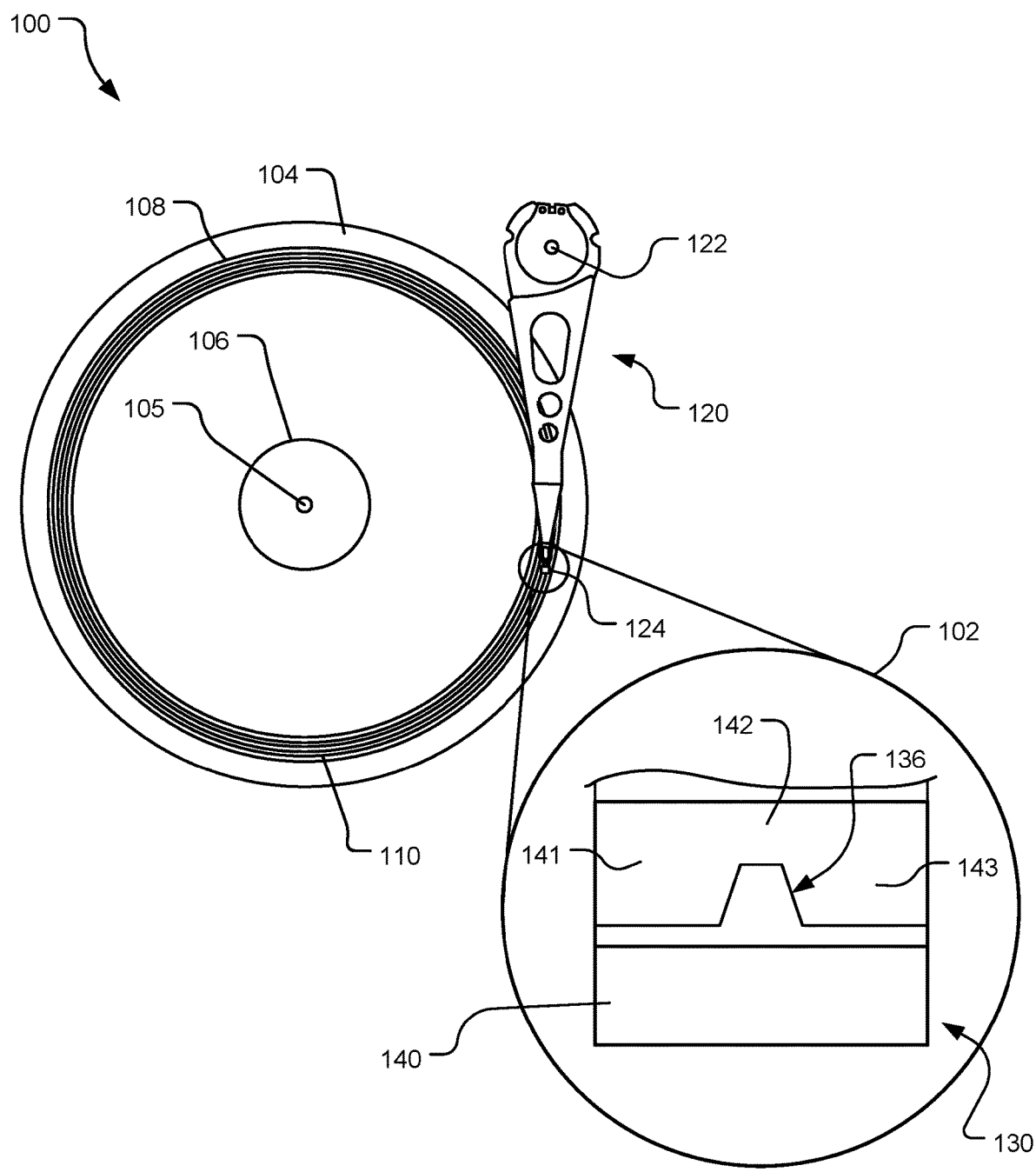
FIG. 1 illustrates a data storage device having an example MR sensor formed by a process of the described technology.

FIG. 1 illustrates a data storage device 100 having an example MR sensor, shown in more detail in an exploded view 102, formed by a process of the described technology. Although other implementations are contemplated, in the illustrated implementation, the data storage device 100 includes a storage medium 104 (e.g., a magnetic data storage disc) on which data bits can be recorded using a magnetic write pole and from which data bits can be read using an MR sensor 130 (shown in the exploded view 102 as a portion of a transducer head assembly 124). The storage medium 104 rotates about a spindle center or a disc axis of rotation 105 during rotation, and includes an inner diameter 106 and an outer diameter 108 between which are a number of concentric data tracks 110. It should be understood that the described technology may be used with a variety of storage formats, including continuous magnetic media, discrete track (DT) media, shingled media, bit patterned media (BPM), etc.

Information may be written to and read from data bit locations in the data tracks 110 on the storage medium 104. The transducer head assembly 124 is mounted on an actuator assembly 120 at an end distal to an actuator axis of rotation 122. The transducer head assembly 124 flies in close proximity above the surface of the storage medium 104 during disc rotation. The actuator assembly 120 rotates during a seek operation about the actuator axis of rotation 122. The seek operation positions the transducer head assembly 124 over a target data track for read and write operations.

The exploded view 102 schematically illustrates an air-bearing surface (ABS) view of an MR sensor 130. The MR sensor 130 includes a monolithic shield including a bottom shield element 140, a top shield element shield 142, and side shield elements 141 and 143. In another implementation, the top shield element 142 has a multi-layer structure that helps to stabilize the side shield elements 141 and 143. Each of the elements 141, 142, and 143 of the monolithic shield is part of an integrated shield formed in a single deposition operation.

The MR sensor 130 further includes a sensor stack 136 located between the bottom shield 140 and the top shield 142 along a down track (y) direction. The top shield 142 wraps around the sensor stack 136 such that it is adjacent to opposite sides of the sensor stack in the cross track (x) direction.

In one implementation, the bottom shield 140 is an AFM stabilized bottom shield that shields and provides stabilization to the sensor stack 136. The sensor stack 136 includes a plurality of layers (not shown) that perform a plurality of different functions. In one implementation, a non-magnetic shield-replacement material (not shown) is included in a region behind the sensor stack 136 to further stabilize the MR sensor 130.

Figure 2:
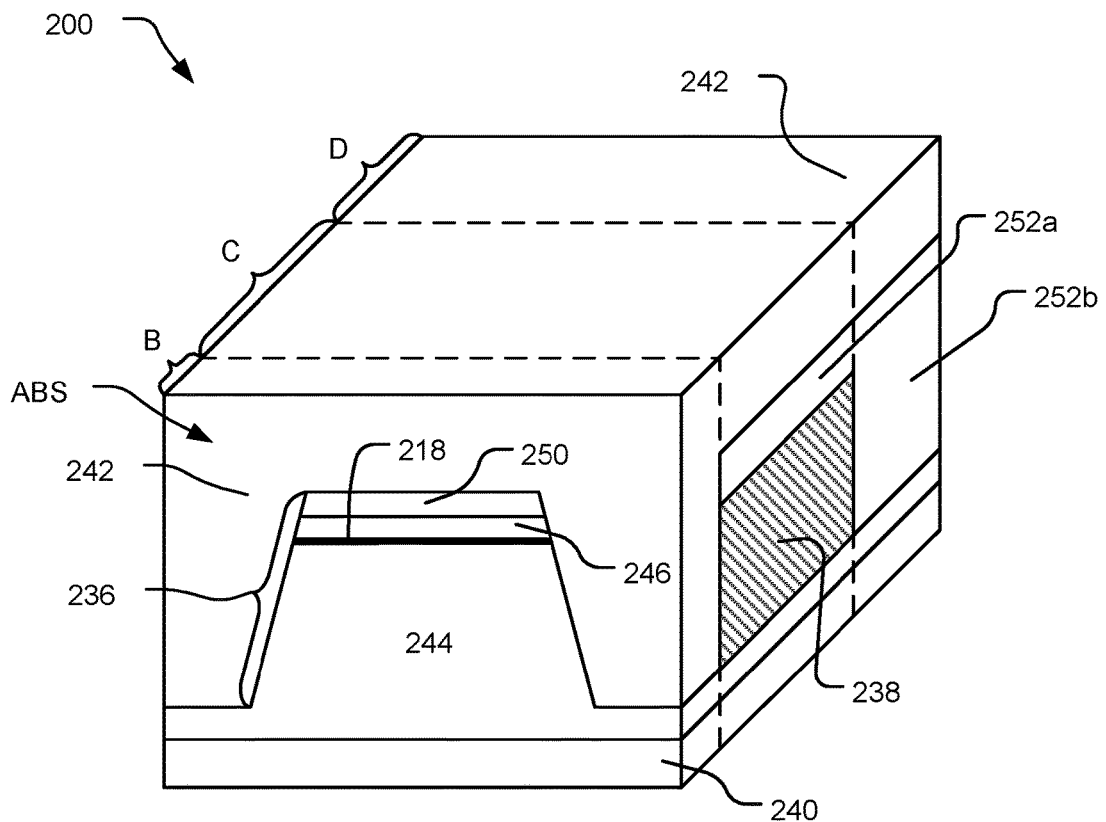
FIG. 2 illustrates a three-dimensional view of an example MR sensor (i.e., View A) with a wrap-around upper shield element and filler material situated behind a sensor stack.

FIG. 2 illustrates a three-dimensional view of an example MR sensor 200 (i.e., View A) with a wrap-around upper shield element 242 and non-magnetic shield-replacement material 228, 238 situated behind a sensor stack 236. When describing various MR sensors and MR sensors herein, three axes are used to describe the perspective of the accompanying figure. The X-axis represents a cross-track axis. A cross-sectional view of the Y-Z plane taken from a position along the X-axis is referred to herein as an "inline" view. The Y-axis represents the down track axis, which is also typically the axis of thin film processing (e.g., the reader stack grows along the Y axis). The Z-axis represents the air bearing surface (ABS) axis, such that any figure depicted in a plane that is orthogonal to the Z axis represents a surface or cross-section that is parallel to the ABS. Thus, a cross-sectional view of the X-Y plane taken from a position along the Z-axis is referred to herein as an ABS-facing view.

Views B, C, and D are illustrative of 3-dimensional "portions" (e.g., slices) of the MR sensor 200, respectively corresponding to a front portion B, a middle portion C, and a back portion D of the MR sensor 200. The front portion B (also referred to as the ABS-portion) is, in operation, situated closest to an adjacent a rotating media. The back portion D is, in operation, situated furthest from the adjacent rotating media. The terms "front portion," "middle portion," and "back portion" are used throughout the application to refer to the relative positions of illustrated cross-sections within the MR sensor 200 and/or other MR sensors.

The MR sensor 200 includes a plurality of layers that perform a plurality of functions. In various implementations, the number of such layers and their associated functions may vary. However, the MR sensor 200 has a sensor stack 236 that includes a synthetic antiferromagnetic (SAF) structure 244 and a free layer 246. In one implementation, the SAF structure 244 includes a reference layer separated from a pinned layer by a non-magnetic spacer layer. The reference layer is magnetically coupled to the pinned layer and the pinned layer has a a magnetic orientation that is pinned in a set direction. The SAF structure 244 is separated from the free layer 246 by a nonmagnetic barrier layer 218. The free layer 246 has a magnetic moment that is free to rotate under the influence of an applied magnetic field. Additionally, the sensor stack 236 includes a capping layer 250. Other implementations may have layers in addition to or in place of those shown and described in FIG. 2.

The MR sensor further includes a lower shield element 240 and a wrap-around upper shield element 242 that wraps around three sides of the sensor stack 236. The lower element 240 and the wrap-around upper shield element 242 are adjacent to opposite sides of the sensor stack 236 along the down track (y) direction. The lower shield element 240 and the wrap-around upper shield element 242 isolate the sensor stack 236 from electromagnetic interference, primarily z-direction interference, and serve as electrically conductive first and second electrical leads connected to processing electronics (not shown). In one implementation, the lower shield element 240 and wrap-around upper shield element 242 permit the sensor stack 236 to be affected by magnetic fields of a data bit adjacent an ABS of the sensor stack 236 while reducing or blocking magnetic field interference of other, adjacent data bits.

In addition to protecting the sensor stack 236 along the down track direction, the wrap-around upper shield element 242 wraps around a portion of the sensor stack 236 to protect the sensor stack 236 from cross-track electromagnetic interference as well. According to one implementation, the wrap-around upper shield element 242 is deposited in a single step. This reduces or eliminates coupling concerns that arise when side shields are deposited separately from the top shield.

A non-magnetic backfill layer includes a stripe isolation region 252a and a back region 252b. The stripe isolation region 252 extends within a middle region of the MR sensor 200 and has an ABS-facing surface adjacent to the sensor stack 236. The back region 252b extends within a back portion of the MR sensor 200 and is separated from the sensor stack 236 by the stripe isolation region 252a.

When the MR sensor 200 is implemented in a storage device, the sensor stack 236 is situated between the ABS adjacent a rotating media and the non-magnetic backfill layer 238. The stripe isolation region 252a of the non-magnetic backfill layer is axially aligned (e.g., along the z-axis) with the free layer 246 and the back region 252b of the non-magnetic backfill layer is aligned axially (e.g., along the z-axis) with both the free layer 246 and the SAF structure 244.

In one implementation, the non-magnetic backfill layer, including the stripe isolation region 252a and back region 252b, is one or more layers of alumina ($AlO_3$) or silicon dioxide ($SiO_2$).

The MR sensor 200 further includes non-magnetic shield-replacement regions 228, 238 (best visible in View C) that are formed on opposite sides of the sensor stack 236 in the cross-track direction. The non-magnetic shield-replacement regions 228 and 238 are separated from the ABS by material of the upper shield element 242 (best visible in View B). The non-magnetic shield-replacement regions 228 and 238 increase stability of the MR sensor 200, and are made of non-magnetic material that is both mechanically and chemically stable.

A mechanically stable material is a material that is not stressed during wafer fabrication, read/write head formation, or during read/write operations of a recording head. A material may be "stressed" if it degrades performance of the recording head or causes damage to the recording head, such as thin film delamination. A chemically stable material a material that can withstand both the wafer fabrication and read/write head formation without causing corrosion or chemical changes to the material. For example, a chemically stable material is chemically inactive during wafer lift-off, chemical-mechanical planarization (CMP), milling, etc.

Materials suitable for use in the non-magnetic shield-replacement regions 228, 238 may have a mill rate that is equal to or less than the mill rate of materials of the wrap-around upper shield element 242 (e.g., NiFe). In one implementation, material of the non-magnetic shield-replacements 228 and 238 is a material that can be selectively etched using a fluorocarbon ($CF_4$) or an oxygen-based plasma. In another implementation, material of the non-magnetic shield-replacement regions 228 and 238 is removable by a commercially available wet etch solution (e.g., METEX Copper striper). Other implementations are also contemplated.

Example materials satisfying one or more of the above-described criteria include without limitation silicon dioxide ($SiO_2$), amorphous carbon, and copper. The non-magnetic shield-replacement material (228, 238) in the middle portion of the MR sensor 200 is included to replace a side shield tail that exists in some other MR sensors between the bottom shield element 240 and the stripe isolation region 252a. The resulting MR sensor 200 exhibits improved stability over these other MR sensors.

Various formation phases of the MR sensor 200 are shown and described in greater detail with respect to FIGS. 3-9. It should be understand that FIGS. 3-9 may each relate to the same implementation (e.g., the implementation of FIG. 2) or to one or more implementations different from FIG. 2 and/or one another.

FIG. 3 illustrates an ABS-facing view of a front portion of an example MR sensor 300 at an early stage of an MR sensor manufacturing process. The MR sensor 300 includes a sensor stack 336 formed on a lower shield 340. The sensor stack 336 has a plurality of layers, including an AFM layer 320, a free layer 346, an SAF structure 344, a nonmagnetic barrier layer 318, and a capping layer 350. Additional layers are also contemplated.

A photomask 354 is formed on the sensor stack 336 to protect the sensor stack 336 during one or more subsequent deposition processes. In one implementation, the photomask 354 is a hardened structure formed by applying droplets of a liquid photoresist across the MR sensor 300 and exposing portions of the liquid photoresist to a high intensity light. The high intensity light changes the solubility of either the exposed or unexposed portions (depending on the type of photoresist). The unchanged portions are removed by a developer solution, leaving behind the photomask 354.

One or more milling operations may be performed to prepare the MR sensor for deposition of a non-magnetic shield replacement material 238. During these milling operations, redeposition material 314 may form on the photomask 354. Thereafter, non-magnetic shield-replacement material 338 is deposited substantially evenly across the MR sensor 300 on both the sensor stack 336 and the photomask 354. The non-magnetic shield-replacement material 338 is a non-magnetic material that can be removed by an etching process. In one implementation, the non-magnetic shield-replacement material 338 is removable by etching with $CF_4$ or an Oxygen-based plasma. In another implementation, the non-magnetic shield-replacement material 338 is removed by a commercially available wet etch solution. Suitable materials include, for example, ($SiO_2$), amorphous carbon, and copper.

FIGS. 4a-4c illustrate an example MR sensor 400 at an early stage of an MR sensor manufacturing process. FIG. 4a illustrates an ABS-facing view of a front portion of the MR sensor 400. FIG. 4b illustrates an inline view of the MR sensor 400 taken along plane F shown in FIG. 4a. FIG. 4c illustrates an inline view of the MR sensor 400 taken along plane G shown in FIG. 4a.

The MR sensor 400 includes a lower shield 440 and a sensor stack 436. Non-magnetic shield-replacement regions 428 and 438 are formed on opposite sides of the sensor stack 436 along the cross-track direction. The sensor stack 436 has a plurality of layers, including an AFM layer 420, a free layer 446, an SAF structure 444, a nonmagnetic barrier layer 418, and a capping layer 450. Additional layers are also contemplated.

The MR sensor 400 is planarized along a plane 'E' that is substantially perpendicular to an ABS. This planarization is performed to remove excess topography from the upper surface of the MR sensor (e.g., the photomask and the overlying non-magnetic shield-replacement material shown in FIG. 3). The planarization is accomplished using one or more lapping, polishing, milling, or chemical-mechanical planarization (CMP) operations.

FIGS. 5a-5c illustrate another example MR sensor 500 at another stage in an MR manufacturing process. FIG. 5a illustrates an inline view of the MR sensor 500 taken through an x-axis center of the MR sensor 500. FIG. 5b illustrates an ABS-facing view of a front portion of the MR sensor 500 taken along plane H in FIG. 5a. FIG. 5c illustrates an ABS-facing view of a middle portion of the MR sensor 500 taken along plane J in FIG. 5a.

Material has been removed from a free layer 546 and a capping layer 550 in both middle and back portions of a sensor stack 536. This removal process can be accomplished by a milling or etching operation that leaves an underlying SAF structure 544 and a lower shield element 540 substantially in-tact. The area previously including the material removed from the free layer 546 and the capping layer 550 is backfilled with a non-magnetic backfill layer 548, which may be alumina or silicon dioxide. The backfill operation can be performed via one or more standard deposition processes.

FIGS. 6a-6c illustrate another example MR sensor 600 at another stage in an MR manufacturing process. FIG. 6a illustrates an inline view of the MR sensor 600 taken through an x-axis center of MR sensor 600. FIG. 6b illustrates an ABS-facing view of a front portion of the MR sensor 600 taken along plane K in FIG. 6a. FIG. 6c illustrates an ABS-facing view of a middle portion of the MR sensor 600 taken along plane L in FIG. 6a.

The MR sensor 600 includes a lower shield element 640, non-magnetic shield-replacement elements 628 and 638, a first non-magnetic backfill layer 648, a second non-magnetic backfill layer 652, and a sensor stack 636. The sensor stack 636 further includes an AFM layer 620, an SAF structure 644, a free layer 646, a capping layer 650, and a nonmagnetic barrier layer 618.

A milling or etching operation removes material from the first non-magnetic backfill layer 648, the AFM layer 620, and the SAF structure 644 in a back portion of the MR sensor 600. In one implementation, the material is removed via a milling operation that is performed while a photomask (not shown) is in place protecting the illustrated portions of the first backfill layer 648 and of the sensor stack 636. For example, the material of the first non-magnetic backfill layer 648 and sensor stack 646 may be milled away in the back portion of the MR sensor 600 to expose the lower shield element 640. Other implementations may have layers in addition to or in place of those shown and described in FIG. 6.

The back portion of the MR sensor 600 is backfilled with material of the second non-magnetic backfill layer 652. In one implementation, the non-magnetic backfill layer 652 is alumina. In one implementation, the non-magnetic backfill layer 652 is silicon dioxide.

FIG. 7 illustrates a top-down view (in the x-z plane) of other example MR sensors 700 and 701 at another stage of an MR manufacturing process. The two MR sensors 700 and 701 are formed at simultaneously and subsequently severed along the separation axis 754. According to one implementation, the illustrated MR sensor 700 is the same MR sensor illustrated in FIGS. 6a-6c, and at the same stage of manufacturing. Visible layers of MR sensor 700 include a first non-magnetic backfill layer 748, a second non-magnetic backfill layer 752, and non-magnetic shield-replacements 728 and 738. The non-magnetic shield-replacements 728 and 738 each include a "tail portion" that extends within z-plane and below the first non-magnetic backfill layer 748 (see, e.g., FIG. 6c). Material of the non-magnetic shield-replacements 728 and 738 that is visible in FIG. 7 is removed via a selective etching process.

FIGS. 8a-8b illustrate another example MR sensor 800 at another stage in an MR manufacturing process. FIG. 8a illustrates an ABS-facing view of a front portion of the MR sensor 800. FIG. 8b illustrates an ABS-facing view of a middle portion of the MR sensor 800. The MR sensor 800 includes a lower shield element 840, an upper shield element 842, non-magnetic shield-replacements 828 and 838, a non-magnetic backfill layer 848, and a sensor stack 836. The sensor stack 836 further includes a capping layer 850, a nonmagnetic barrier layer 818, a free layer 846, an SAF structure 844, and an AFM layer 820. Non-magnetic shield-replacement material previously surrounding the sensor stack 836 in a front portion of the MR sensor 800 (such as that shown in FIGS. 6b and 7) has been etched away. An upper shield element 842, which may be a soft magnetic material, is deposited, in a single step, substantially evenly across the MR sensor 800. As shown in FIG. 8a, the upper shield element 842 substantially surrounds the front portion of the reader stack.

FIGS. 9a-9b illustrate another example MR sensor 900 at another stage in an MR manufacturing process. FIG. 9a illustrates an ABS-facing view of a front portion of the MR sensor 900. FIG. 9b illustrates an ABS-facing view of a middle portion of the MR sensor 900. The MR sensor 900 includes a lower shield element 940, an upper shield element 942, non-magnetic shield-replacements 928 and 938, a non-magnetic backfill layer 948, and a sensor stack 936. The sensor stack 936 further includes a capping layer 950, a free layer 946, a nonmagnetic barrier layer 918, an SAF structure 944, and an AFM layer 920. Excess material (e.g., material shown in FIG. 8a) of an upper shield element 942 is removed by a milling or polishing operation so that the MR sensor 900 is substantially planarized along a plane 'M.'

Figure 10:
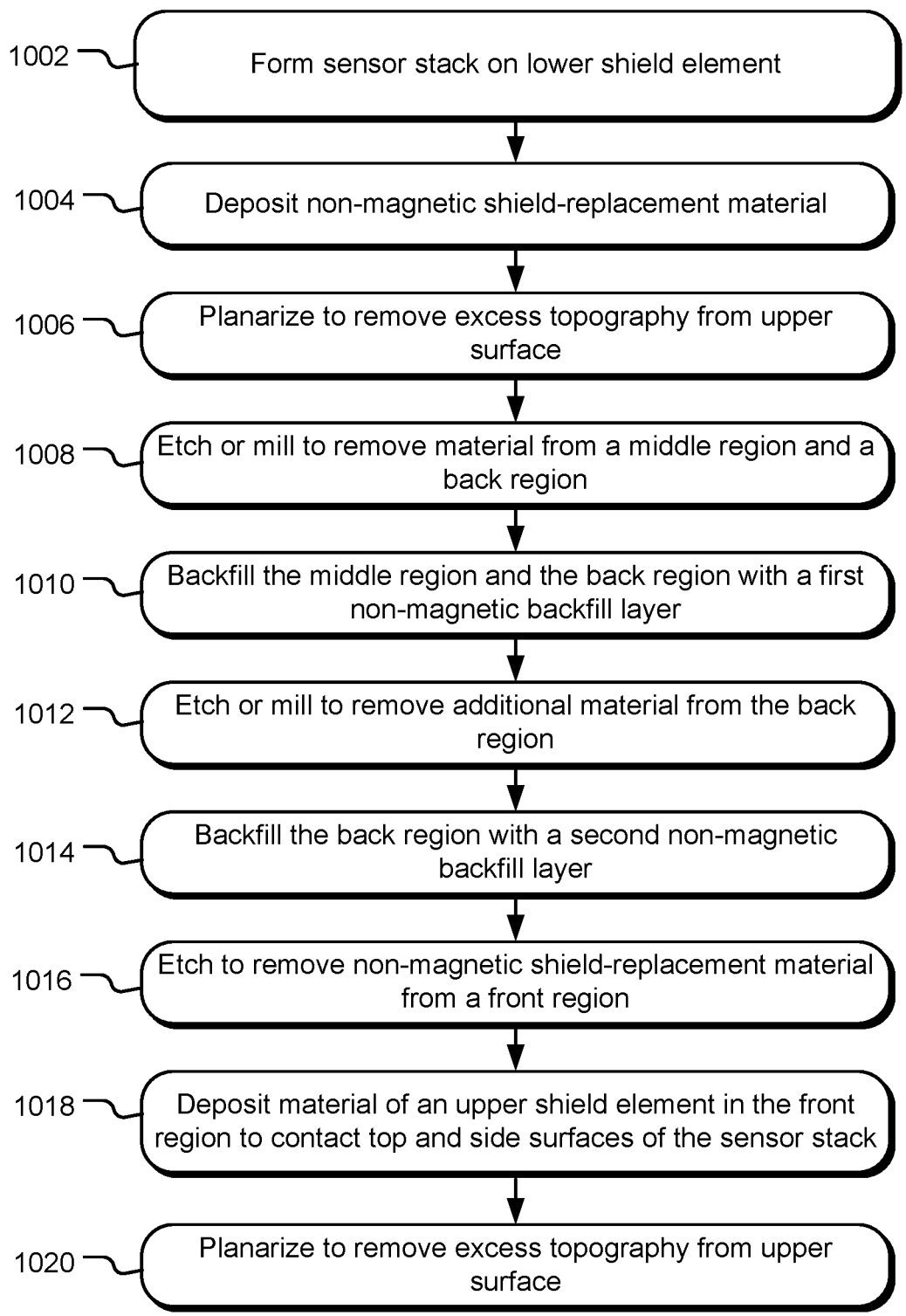
FIG. 10 illustrates example operations for manufacturing an MR sensor.

FIG. 10 illustrates example operations for manufacturing an MR sensor. A formation operation 1002 forms a sensor stack on a lower shield element of an MR sensor. The formation operation 1002 includes one or more individual deposition and etching operations to pattern and form the MR sensor. Thereafter, a deposition 1004 operation deposits non-magnetic shield-replacement material substantially evenly across the MR sensor. In one implementation, the non-magnetic shield-replacement material is a non-magnetic material that can be selectively removed via a wet or dry etching process. Suitable materials include without limitation silicon oxide, amorphous carbon, and copper. The amount of material deposited may be sufficient to bring the non-magnetic shield-replacement material into contact with the top edges of the sensor stack.

A planarization operation 1006 planarizes an upper surface of the MR sensor, exposing a top layer of the sensor stack. The planarization operation 1006 is accomplished using one or more lapping, polishing, milling, or chemical-mechanical planarization (CMP) operations.

An etching or milling operation 1008 removes sensor stack material from a middle portion and a back portion of the MR sensor. In particular, the milling or etching operation 1008 removes material from a free layer, a capping layer, as well as one or more additional layers, while leaving an SAF structure of the sensor stack substantially in tact across front, middle, and back portions of the MR sensor. The layers affected by the milling or etching operation 1008 may remain substantially in-tact within a front portion of the MR sensor.

A backfill operation 1010 backfills the etched or milled areas of the middle and back portions with a first non-magnetic backfill layer. This backfilling may be performed using or more standard deposition techniques.

Another etching or milling operation 1012 removes material from the back portion of the MR sensor. In one implementation, material in the back portion is milled away to expose a lower shield element. For example, substantially all material of the first non-magnetic backfill layer and the sensor stack may milled away from the back portion.

Another backfill operation 1014 backfills the back portion affected by the etching or milling operation 1012 with a second non-magnetic backfill layer. In one implementation, the second non-magnetic backfill layer is alumina.

An etching operation 1016, which may be a wet or dry etch, removes substantially all of the non-magnetic shield-replacement material from the front portion of the MR sensor. In one implementation, the etching operation 1016 does not substantially affect non-magnetic shield-replacement material in the middle portion of the MR sensor that underlies the first non-magnetic backfill layer. This remaining non-magnetic shield-replacement material is included as a filler to assume the place of a side shield tail that may otherwise form consequent to the MR sensor manufacturing process. The resulting MR sensor exhibits improved stability over MR sensors including the side shield tail.

A deposition operation 1018 deposits upper shield material in the front portion of the MR sensor so that a resulting wrap-around upper shield element substantially surrounds both the top of the sensor stack and opposite sides of the sensor stack in the cross-track direction. The wrap-around shield element is deposited in a single step and that acts as both a top shield and side shields. A planarization operation 1020 planarization a top surface of the MR sensor to remove excess surface topography. To further stabilize the MR sensor, a second upper shield (not shown herein) with a pinned structure may be deposited on the MR sensor to pin the magnetic field of the wrap-around shield.

The above specification, examples, and data provide a complete description of the structure and use of exemplary implementations of the technology. Since many implementations of the technology can be made without departing from the spirit and scope of the technology, the invention resides in the claims hereinafter appended. Furthermore, structural features of the different implementations may be combined in yet another implementation without departing from the recited claims.

What is claimed is:

1. A method comprising:
    removing non-magnetic material from a front portion of a magnetoresistive (MR) sensor including an air-bearing surface (ABS) while leaving the non-magnetic material in-tact in a middle region of the MR sensor, the middle region being separated from the ABS by the front portion of the MR sensor;
    forming a monolithic shield of the MR sensor in a single deposition operation, the monolithic shield being deposited on the front portion of the MR sensor from which the non-magnetic material was removed and including a top shield element, a first side shield element on a first side of a synthetic anti-ferromagnet (SAF) structure and a second shield element on an opposite side of the SAF structure.

2. The method of claim 1 further comprising:
    depositing the non-magnetic material adjacent opposite sides of the SAF structure in a cross-track direction.

3. The method of claim 1, wherein the monolithic shield element isolates the non-magnetic material in the middle region of the MR sensor from the ABS such that the monolithic shield is between the ABS and the non-magnetic material.

4. The method of claim 2, wherein the monolithic shield is axially aligned with the non-magnetic material in a down-track direction and a cross-track direction.

5. The method of claim 2, wherein the non-magnetic material is a material that can be selectively etched using at least one of fluorocarbon ($CF_4$), an oxygen-based plasma, and a wet etch solution.

6. The method of claim 2, wherein the SAF structure is included within a sensor stack and the non-magnetic material is axially aligned with the SAF structure and not axially aligned with a free layer of the sensor stack.

7. The method of claim 1, wherein the non-magnetic material is at least one of silicon dioxide ($SiO_2$), amorphous carbon, and copper.

* * * * *